(12) United States Patent
Utsunomiya et al.

(10) Patent No.: US 8,536,673 B2
(45) Date of Patent: Sep. 17, 2013

(54) LIGHT RECEIVING CIRCUIT

(75) Inventors: Fumiyasu Utsunomiya, Chiba (JP); Taro Yamasaki, Chiba (JP); Isamu Fujii, Chiba (JP)

(73) Assignee: Seiko Instruments Inc., Chiba (JP)

( * ) Notice: Subject to any disclaimer, the term of this patent is extended or adjusted under 35 U.S.C. 154(b) by 98 days.

(21) Appl. No.: 13/092,578

(22) Filed: Apr. 22, 2011

(65) Prior Publication Data
US 2011/0272749 A1    Nov. 10, 2011

(30) Foreign Application Priority Data

May 6, 2010    (JP) .................. 2010-106328
Nov. 10, 2010  (JP) .................. 2010-251817

(51) Int. Cl.
*H01L 27/146*    (2006.01)
*H01L 31/062*    (2012.01)

(52) U.S. Cl.
USPC ............. 257/444; 257/292; 257/21; 257/414; 257/458; 257/E27.122; 250/338.02; 250/214

(58) Field of Classification Search
USPC .......... 257/290, 431, 432, 444, 462, E31.001, 257/21, 23, 184, 186, 257, 292, 414, 428, 257/458, 461, E27.118, E27.122, E27.123; 250/214 A, 214 R, 214 LA, 200, 205, 338.1, 250/339.02, 214
See application file for complete search history.

(56) References Cited

U.S. PATENT DOCUMENTS 5,627,733 A * 5/1997 Bressler ............... 363/21.09
(Continued)

FOREIGN PATENT DOCUMENTS

JP    09-083452    *   3/1997
JP    09-083452 A      3/1997

OTHER PUBLICATIONS

Szw, Semiconductor Devices Physics and Technology, 2nd edition, pp. 186-188.*

(Continued)

*Primary Examiner* — Cuong Q Nguyen
*Assistant Examiner* — Galina Yushina
(74) *Attorney, Agent, or Firm* — Brinks Hofer Gilson & Lione

(57) ABSTRACT

Provided is a light receiving circuit for detecting a change in amount of light, in which an input circuit at a subsequent stage is compact and inexpensive and current consumption is low. The light receiving circuit includes: a photoelectric conversion element for supplying a current corresponding to an amount of incident light; an N-channel MOS transistor including a drain supplied with the current from the photoelectric conversion element; and a control circuit for controlling a gate voltage of the NMOS transistor via a low pass filter so that a drain voltage of the N-channel MOS transistor becomes a desired voltage. The control circuit outputs a control state output signal, which is a GND terminal voltage when a delay amount of control on the gate voltage of the NMOS transistor performed via the low pass filter is less than a desired delay amount, and is the drain voltage of the NMOS transistor when the delay amount of control on the gate voltage of the NMOS transistor performed via the low pass filter is the desired delay amount or more. The light receiving circuit outputs the control state output signal as an output signal.

3 Claims, 6 Drawing Sheets

(56) References Cited

U.S. PATENT DOCUMENTS

| | | | | |
|---|---|---|---|---|
| 5,734,300 | A | * | 3/1998 | Yoder .......................... 330/308 |
| 6,130,713 | A | * | 10/2000 | Merrill ......................... 348/308 |
| 7,755,020 | B2 | * | 7/2010 | Sakura et al. ............. 250/214 R |
| 2003/0053498 | A1 | * | 3/2003 | Hamasaki et al. .............. 372/36 |
| 2009/0012729 | A1 | * | 1/2009 | Okayasu et al. ................ 702/82 |
| 2009/0166510 | A1 | * | 7/2009 | Park et al. .................... 250/205 |

OTHER PUBLICATIONS

Bazuin et al. Analog and RF Filters Design Manual, Western Michigan University, p. 18.*

* cited by examiner

FIG. 11 PROIR ART
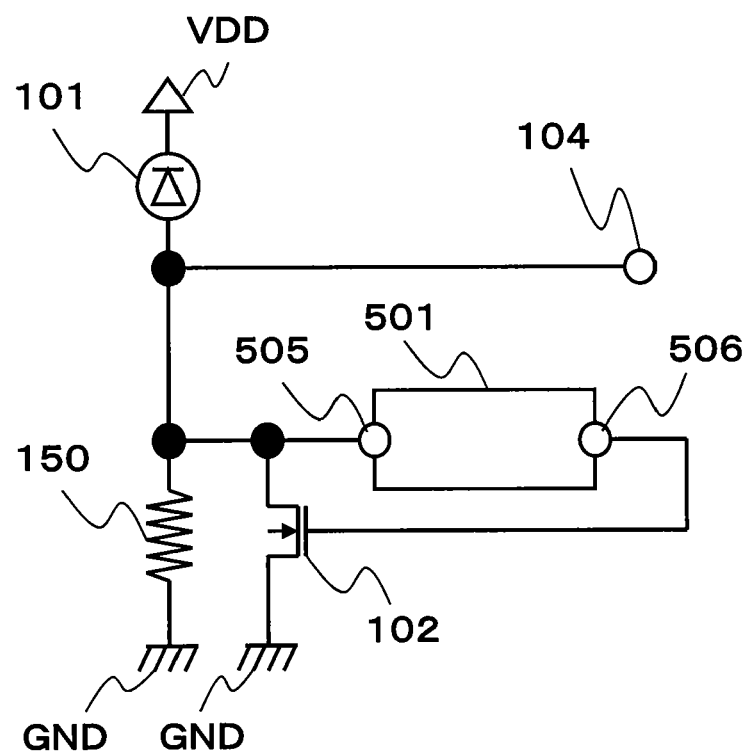

LIGHT RECEIVING CIRCUIT

RELATED APPLICATIONS

This application claims priority under 35 U.S.C. §119 to Japanese Patent Application Nos. 2010-106328 filed on May 6, 2010 and 2010-251817 filed on Nov. 10, 2010, the entire contents of which are hereby incorporated by reference.

BACKGROUND OF THE INVENTION

1. Field of the Invention

The present invention relates to a light receiving circuit for detecting a change in amount of light, and more particularly, to a light receiving circuit capable of stable detection of a change in amount of light regardless of ambient light conditions.

2. Description of the Related Art

Light receiving circuits are used for receiving optical signals in infrared remote control communications or visible light communications and used for light-reflection type distance sensors using photointerrupters or trigonometry. The light receiving circuit absolutely needs to function to detect a change in amount of light accompanying ON/OFF of light or a change in amount of incident light or reflected light, but also needs to be capable of detecting the change in amount of light regardless of ambient light conditions.

FIG. 11 illustrates a conventional light receiving circuit. The conventional light receiving circuit is constituted by a photodiode 101, a resistive element 150, a low pass filter 501, an N-channel MOS transistor (hereinafter, abbreviated to NMOS transistor) 102, and an output terminal 104. The photodiode 101 has a photoelectric conversion function for converting an optical signal or a change in amount of light into a current change. The resistive element 150 converts the current change obtained by the photoelectric conversion of the photodiode 101 into a voltage change. The NMOS transistor 102 has a gate supplied with a drain voltage via the low pass filter 501. The output terminal 104 outputs a change in voltage generated across the resistive element 150.

The photodiode 101 has an N terminal connected to a VDD terminal, and a P terminal connected to the output terminal 104, one terminal of the resistive element 150, a drain of the NMOS transistor 102, and an input terminal 505 of the low pass filter 501. The other terminal of the resistive element 150 is connected to a GND terminal. The low pass filter 501 has an output terminal 506 connected to the gate of the NMOS transistor 102. The NMOS transistor 102 has a source connected to the GND terminal. Although not illustrated, the VDD terminal is supplied with a positive voltage from a power source and the GND terminal is supplied with a reference voltage from the power source.

The light receiving circuit having the above-mentioned configuration operates as follows to detect a change in amount of incident light.

When the environment is dark, no steady current flows through the photodiode 101, and hence a voltage at the output terminal 104 is almost a GND terminal voltage and the NMOS transistor 102 is OFF. Therefore, a voltage to be output from the output terminal 104 is a voltage generated when the current of the photodiode 101, which changes as the amount of light entering the photodiode 101 changes, flows through the resistive element 150. On the other hand, when the environment is bright, a steady current flows through the photodiode 101, and hence a potential difference across the resistive element 150 is increased by the current. If the flow of the steady current through the photodiode 101 increases the potential difference across the resistive element 150 to exceed a threshold voltage of the NMOS transistor 102, the output terminal 104 is controlled by the NMOS transistor 102 so as to be around the threshold voltage of the NMOS transistor 102. In other words, however bright the environment is, the voltage of the output terminal 104 is not increased to a VDD terminal voltage but increased to around the threshold voltage of the NMOS transistor 102. Therefore, the output terminal 104 outputs a voltage waveform that has no peak at the VDD terminal voltage, with the result that even if the environment is very bright, the output voltage is changed by the change in amount of light. In other words, the change in amount of light can be detected regardless of ambient light conditions.

When the environment is bright and the voltage at the output terminal 104 is controlled to be around the threshold voltage of the NMOS transistor 102, a current flows through the NMOS transistor 102, too. However, a gate voltage of the NMOS transistor 102 is changed via the low pass filter 501, and hence the change rate is slow. Besides, the low pass filter 501 is set so as to pass only a signal at an extremely low frequency. Therefore, the current flowing through the NMOS transistor 102 is regarded as a constant current with respect to an instantaneous current change, and hence the NMOS transistor 102 has little influence on lowering the light receiving sensitivity.

In addition, in order not to detect a slow change in amount of light that occurs by a person moving across the sensor, a human hand coming close thereto, a curtain waving in the wind, or the like, the low pass filter 501 is set to have a pass frequency capable of passing frequency components of a voltage change accompanying a current change that occurs by the change in the amount of light.

Further, although not illustrated, the conventional light receiving circuit needs, at the output thereof, an input circuit for converting a signal of less than CMOS level, which is to be output from the output terminal of the conventional light receiving circuit, into a signal of the CMOS level.

In the conventional light receiving circuit described above, the current of the photodiode is allowed to flow through the NMOS transistor in which the source is connected to the GND terminal and the drain voltage is supplied as the gate voltage via the low pass filter. Accordingly, even if the environment is bright and the current of the photodiode 101 is large, the output voltage is prevented from exceeding around the threshold voltage of the NMOS transistor 102. Therefore, the output voltage is changed by the change in amount of light regardless of ambient light conditions (see, for example, Japanese Patent Application Laid-open No. Hei 09-083452).

As described above, the conventional light receiving circuit has a configuration in which the output voltage varies based on the change in amount of light regardless of ambient light conditions. However, as described above, when the environment is dark, the conventional light receiving circuit outputs a voltage that changes mainly around at the GND terminal voltage according to the change in amount of light. When the environment is bright, on the other hand, the conventional light receiving circuit outputs a voltage that changes mainly around at the threshold voltage of the built-in NMOS transistor according to the change in amount of light. Accordingly, if the output of the conventional light receiving circuit is input to a simple CMOS level input circuit such as a CMOS inverter, when the environment is dark, the input signal cannot be detected because a level of the input signal is low and a voltage change accompanying the change in amount of light is very small. On the other hand, when the environment is bright, a through current flows to the CMOS level input circuit because the input signal is not at the CMOS level or more. Therefore, the input circuit at the subsequent stage needs to use an amplifier circuit or the like so as to have a wide DC voltage range with respect to the input voltage. In this case, however, the input circuit at the subsequent stage has a complicated, expensive configuration, and the use of an amplifier or the like steadily consumes a current by the amplifier circuit. In other words, the conventional light receiving circuit has a problem that an input part at a subsequent stage is complicated and expensive and also a consumption current of the input part at the subsequent stage is increased. In addition, all the current of the photodiode flows to the GND terminal, and hence there is another problem that when the environment is bright, a consumption current of the light receiving circuit is increased. Besides, in order to allow the conventional light receiving circuit to detect a weak change in amount of light, such as an optical signal output from a remote place, the light receiving sensitivity needs to be increased. However, in order to increase the light receiving sensitivity of the conventional light receiving circuit, the above-mentioned resistive element needs to be increased in resistance. In other words, the conventional light receiving circuit requires high resistance of the above-mentioned resistive element for increasing the light receiving sensitivity, with the result that the occupied area of the above-mentioned resistive element becomes too large to form the light receiving circuit within an IC chip. Therefore, there is another problem that it is necessary to add an external resistive element, which is expensive and requires a space.

SUMMARY OF THE INVENTION

The present invention has been made in view of the above-mentioned problems, and provides a light receiving circuit capable of employing a configuration in which an input circuit at a subsequent stage is compact and inexpensive as compared to a conventional light receiving circuit, and current consumption is almost zero. Further, the present invention provides a light receiving circuit capable of increasing light receiving sensitivity with low cost as compared to a conventional light receiving circuit without using an external resistive element, which is expensive and requires a space.

In order to solve the above-mentioned problems inherent in the conventional light receiving circuit, a light receiving circuit according to the present invention includes: a photoelectric conversion element for supplying a current corresponding to an amount of incident light; an NMOS transistor including a drain supplied with the current of the photoelectric conversion element; and a control circuit including an input terminal supplied with a drain voltage of the NMOS transistor, for controlling a gate voltage of the NMOS transistor based on a control signal, in which the control circuit includes a delay circuit, and when the drain voltage of the NMOS transistor is changed, the control circuit outputs a control state output signal corresponding to a delay amount of the delay circuit, and the light receiving circuit outputs the control state output signal as a detection signal of a change in the amount of the incident light.

According to the light receiving circuit of the present invention, the size thereof can be reduced and the light receiving sensitivity can be increased as compared to the conventional light receiving circuit, and in addition, peripheral circuitry can be made compact to achieve low current consumption.

BRIEF DESCRIPTION OF THE DRAWINGS

In the accompanying drawings:

FIG. 11 is a schematic circuit diagram illustrating a circuit configuration of a conventional light receiving circuit.

DETAILED DESCRIPTION OF THE PREFERRED EMBODIMENTS

Referring to the accompanying drawings, embodiments of the present invention are described below.

First Embodiment

Figure 1:
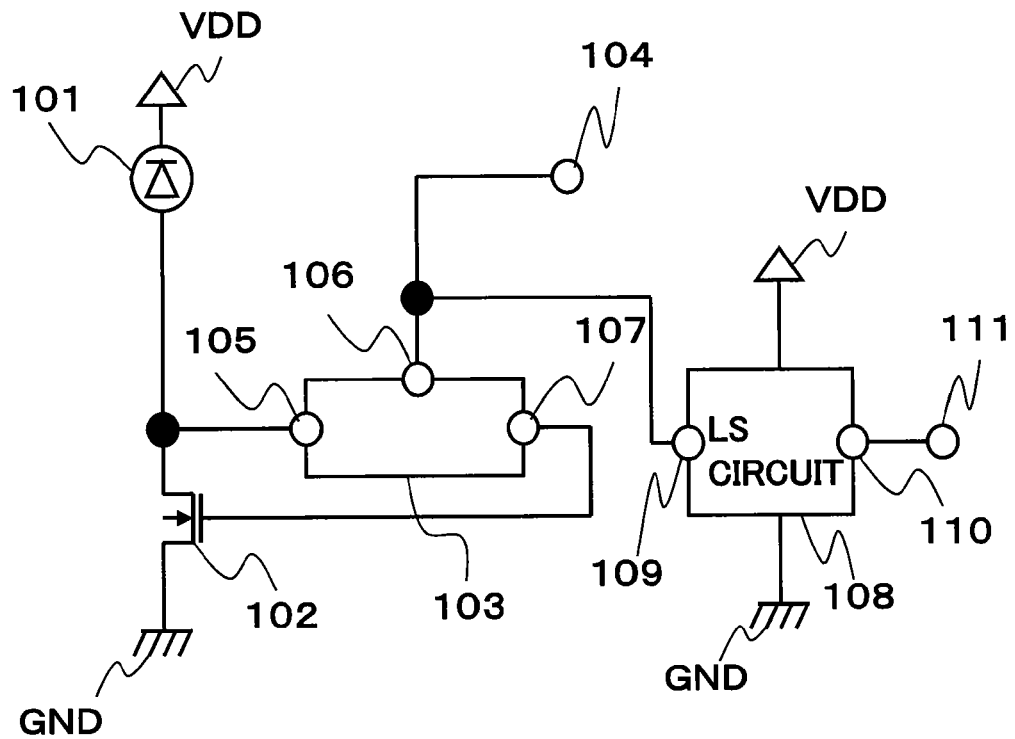
FIG. 1 is a schematic circuit diagram illustrating a light receiving circuit according to a first embodiment of the present invention.

FIG. 1 is a schematic circuit diagram illustrating a light receiving circuit according to a first embodiment of the present invention.

The light receiving circuit according to the first embodiment includes a photodiode 101, an N-channel MOS transistor (hereinafter, abbreviated to NMOS transistor) 102, a control circuit 103, an output terminal 104, a level shift circuit 108, and a CMOS level signal output terminal 111.

The photodiode 101 has an N terminal connected to a VDD terminal, and a P terminal connected to a drain of the NMOS transistor 102 and an input terminal 105 of the control circuit 103. The control circuit 103 has a control state signal output terminal 106 connected to the output terminal 104 and an input terminal 109 of the level shift circuit 108, and a control terminal 107 connected to a gate of the NMOS transistor 102. The NMOS transistor 102 has a source connected to a GND terminal. The level shift circuit 108 has an output terminal 110 connected to the CMOS level signal output terminal 111. Although not illustrated, the VDD terminal is supplied with a positive voltage from a power source and the GND terminal is supplied with a reference voltage from the power source.

The photodiode 101 has the photoelectric conversion characteristics and supplies a current corresponding to the amount of incident light. The NMOS transistor 102 allows the current supplied from the photodiode 101 to flow from its drain to its source. The control circuit 103 monitors a drain voltage of the NMOS transistor 102 at the input terminal 105. The control circuit 103 controls the gate of the NMOS transistor 102 via an internal low pass filter and the control terminal 107 so that the drain voltage of the NMOS transistor 102 may be a desired voltage. Further, the control circuit 103 outputs from the control state signal output terminal 106 a signal for notifying a state of control operation delay caused by the internal low pass filter. Then, the level shift circuit 108 converts the signal input from the input terminal 109 into a CMOS level signal, and outputs the converted CMOS level signal from the output terminal 110.

The signal to be output from the control state signal output terminal 106 of the control circuit 103 is a signal at a GND terminal voltage when the control delay of the control circuit 103 is less than a predetermined delay amount. On the other hand, when the control delay is the predetermined delay amount or more, a signal of H at a drain voltage level of the NMOS transistor 102 is output. Further, the CMOS level signal to be output from the output terminal 110 of the level shift circuit 108 to the CMOS level signal output terminal 111 is a signal of H at a VDD terminal voltage when the signal output from the output terminal 104 is the GND terminal voltage. On the other hand, when the signal to be output from the output terminal 104 is the signal of H at the drain voltage level of the NMOS transistor 102, a signal of L at the GND terminal voltage is output.

The light receiving circuit having the above-mentioned configuration operates as follows to detect a change in the amount of incident light.

When the environment is dark, no steady current flows through the photodiode 101, and hence the drain of the NMOS transistor 102 is almost at the GND terminal voltage. Accordingly, the input terminal 105 of the control circuit 103 is almost at the GND terminal voltage. Therefore, the gate of the NMOS transistor 102 is almost at the GND terminal voltage, and hence the NMOS transistor 102 is OFF and also the output terminal 104 is almost at the GND terminal voltage. Consequently, the signal of H at the VDD terminal voltage is output from the CMOS level signal output terminal 111.

Subsequently, in the above-mentioned dark environment, if an optical signal enters or the environment becomes bright suddenly, and the current suddenly flows from the photodiode 101, the drain voltage of the NMOS transistor 102 is increased until the current flowing to the NMOS transistor 102 is increased to the current supplied from the photodiode 101. The period in which the drain voltage of the NMOS transistor 102 is increased corresponds to a period in which the control of the control circuit 103 is delayed. Accordingly, during this period, the voltage at the control state signal output terminal 106 of the control circuit 103 is the drain voltage of the NMOS transistor 102. Therefore, during the above-mentioned period, the output terminal 104 outputs the signal of H at the drain voltage of the NMOS transistor 102, and the signal of L at the GND terminal voltage is output to the CMOS level signal output terminal 111.]

On the other hand, when the environment is bright, a steady current flows through the photodiode 101, and hence the drain of the NMOS transistor 102 is controlled by the control circuit 103 so as to be around a desired voltage. Further, in this case, the control of the control circuit 103 is not delayed as well, and hence the control state signal output terminal 106 of the control circuit 103 is almost at the GND terminal voltage. Accordingly, the output terminal 104 outputs the signal of L at the GND terminal voltage level, and the signal of H at the VDD terminal voltage is output to the CMOS level signal output terminal 111.

Subsequently, in the above-mentioned bright environment, if an optical signal enters or the environment becomes more bright and the current from the photodiode 101 is suddenly increased, the drain voltage of the NMOS transistor 102 is increased until the current flowing to the NMOS transistor 102 is increased to the current of the photodiode 101. The period in which the drain voltage of the NMOS transistor 102 is increased corresponds to a period in which the control of the control circuit 103 is delayed. Accordingly, during this period, the voltage at the control state signal output terminal 106 of the control circuit 103 is also the drain voltage of the NMOS transistor 102. Therefore, during the above-mentioned period, the output terminal 104 outputs the signal of H at the drain voltage of the NMOS transistor 102, and the signal of L at the GND terminal voltage is output to the CMOS level signal output terminal 111.

After a while since the optical signal entered or the environment became bright suddenly, the NMOS transistor 102 can allow a current corresponding to the suddenly-increased amount of the photodiode 101 to flow. It should be therefore understood that the state returns to the above-mentioned state before the optical signal enters or the environment becomes bright suddenly.

Further, if the optical signal enters or the environment becomes more bright, and the drain voltage of the NMOS transistor 102 is still increased to the VDD terminal voltage level, the signal of the output terminal 104 is the CMOS level signal, and hence it should be understood that the level shift circuit becomes unnecessary.

As described above, according to the light receiving circuit of the first embodiment, the current of the photodiode, which changes instantaneously, is caused to flow to the NMOS transistor having a very high resistance with respect to the instantaneously changing current. Therefore, the light receiving sensitivity is increased. Further, the NMOS transistor can be formed in the IC to remove an external part, to thereby reduce the size and cost. Besides, the voltage at the output terminal is the GND terminal voltage, and hence an input circuit at a subsequent stage can be formed of a level shift circuit or the like, which has a simple configuration in which no steady consumption current flows. Therefore, the input circuit at the subsequent stage can be made compact and the steady consumption current can also be eliminated.

Second Embodiment

Figure 2:
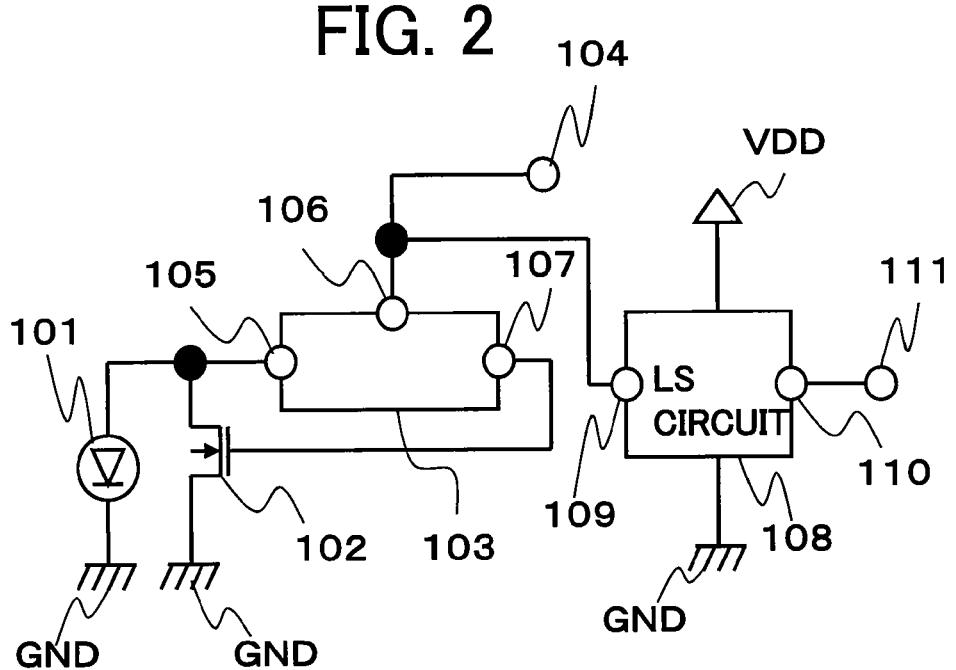
FIG. 2 is a schematic circuit diagram illustrating a light receiving circuit according to a second embodiment of the present invention.

FIG. 2 is a schematic circuit diagram illustrating a light receiving circuit according to a second embodiment of the present invention.

As illustrated in FIG. 2, the light receiving circuit according to the second embodiment has substantially the same configuration as the light receiving circuit of the first embodiment illustrated in FIG. 1. The only difference is that the first embodiment of the present invention provides the configuration in which the N terminal of the photodiode 101 is connected to the VDD terminal, but in the second embodiment of the present invention, the N terminal of the photodiode 101 is connected to the GND terminal.

Further, the components other than the above-mentioned photodiode 101 are connected in the same way as in the first embodiment of the present invention.

Besides, operations of the light receiving circuit according to the second embodiment are substantially the same as the operations of the light receiving circuit according to the first embodiment illustrated in FIG. 1. The difference is that the drain voltage of the NMOS transistor 102 increases to around the VDD terminal voltage in some cases in the first embodiment of the present invention, but in the second embodiment of the present invention, the drain voltage of the NMOS transistor 102 increases only to a generated voltage of the photodiode 101. Accordingly, in the second embodiment of the present invention, the voltage to be output from the control state signal output terminal 106 of the control circuit 103 is also the generated voltage of the photodiode 101 or lower. Therefore, if it is necessary to output a CMOS level signal higher than the generated voltage, the level shift circuit 108 is necessary.

As described above, in the light receiving circuit according to the first embodiment, the current of the photodiode flows from the VDD terminal to the GND terminal, and hence the current of the photodiode is a consumption current of the light receiving circuit. Accordingly, when the environment is bright, the current of the photodiode is increased and as a result, the consumption current is also increased. However, in the light receiving circuit according to the above-mentioned second embodiment, a generated current of the photodiode is used, and hence the current of the photodiode does not flow from the VDD terminal to the GND terminal. Further, if there is no change in the amount of incident light, the level shift circuit consumes no current at all, either, because the GND terminal voltage is input to the input terminal thereof. Therefore, the light receiving circuit according to the second embodiment has the feature in that almost no consumption current is consumed, in addition to the feature of the light receiving circuit according to the first embodiment.

Now, a detailed configuration and operation of the control circuit 103 is described by way of specific circuit example.

Figure 3:
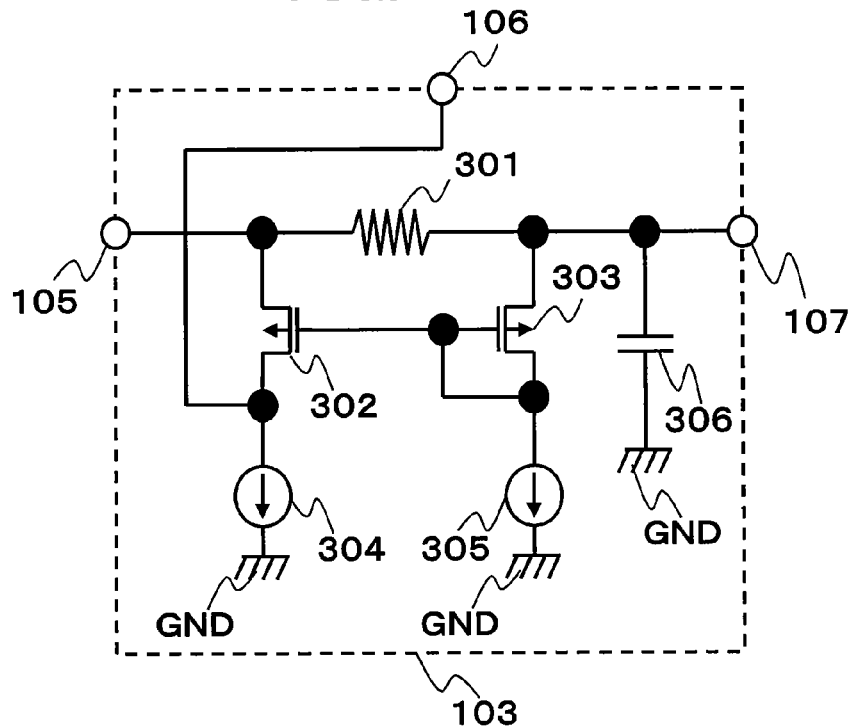
FIG. 3 is a circuit diagram illustrating an example of a control circuit used in the light receiving circuit.

FIG. 3 is a circuit diagram illustrating an example of the control circuit 103 used in the light receiving circuit. The control circuit 103 includes a resistive element 301, P-channel MOS transistors (hereinafter, abbreviated to PMOS transistors) 302 and 303, constant current circuits 304 and 305, and a capacitor 306. The constant current circuit 304 and the constant current circuit 305 supply currents of the same value. Further, the PMOS transistor 302 has a smaller K-value than the PMOS transistor 303.

The resistive element 301 has one terminal connected to the input terminal 105 and the other terminal connected to the control terminal 107. The PMOS transistor 302 has a drain connected to a current inflow terminal of the constant current circuit 304 and the control state signal output terminal 106, a gate connected to a gate and a drain of the PMOS transistor 303 and a current inflow terminal of the constant current circuit 305, and a source connected to the input terminal 105. The PMOS transistor 303 has a source connected to the control terminal 107. The constant current circuits 304 and 305 each have a current outflow terminal connected to the GND terminal. The capacitor 306 has one terminal connected to the control terminal 107 and the other terminal connected to the GND terminal.

The control circuit having the above-mentioned configuration operates as follows to detect a change in input current.

First, a case where a total current value of the constant current circuits 304 and 305 flows from the input terminal 105 is described. In the resistive element 301, a voltage ΔV is generated by the current of the constant current circuit 305. Accordingly, a potential difference between the source and the gate of the PMOS transistor 302 is higher than a potential difference between the source and the gate of the PMOS transistor 303 by ΔV. However, because the PMOS transistor 302 has a smaller K-value than the PMOS transistor 303, even if the source-gate voltage is increased by ΔV, the PMOS transistor 302 can allow a smaller drain current to flow than that of the PMOS transistor 303. Therefore, the constant current value of the constant current circuit 304 is larger than the drain current that the PMOS transistor 302 can supply, and hence the control state signal output terminal 106 outputs the signal of L at the GND terminal voltage.

Next, a case where the current from the input terminal 105 is suddenly increased is described. The voltage at the input terminal 105 is increased by the suddenly-increased current, but the voltage at the control terminal 107 is not increased suddenly because of the capacitor 306. Accordingly, the potential difference between the source and the gate of the PMOS transistor 302 is even higher than the potential difference between the source and the gate of the PMOS transistor 303. Therefore, the drain current that the PMOS transistor 302 can supply is larger than the drain current that the PMOS transistor 303 can supply. Consequently, the drain current that the PMOS transistor 302 can supply is larger than the constant current value of the constant current circuit 304, and the control state signal output terminal 106 is increased to the voltage at the input terminal 105.

Then, after a while the voltage of the control terminal 107 is increased, and the drain current of the NMOS transistor 102 is increased by the increased amount of the current from the input terminal 105. Then, the state returns again to a state in which the total current value of the constant current circuits 304 and 305 flows from the input terminal 105.

As described above, in the control circuit illustrated in FIG. 3, as long as the input terminal voltage is controlled to a desired voltage, the control state signal output terminal outputs the signal of L at the GND terminal voltage. If the control of the input terminal voltage is delayed because the current flowing from the input terminal is increased suddenly, the control state signal output terminal outputs the signal of H at the input terminal voltage.

Note that, in the control circuit of FIG. 3 used in the first or second embodiment, the constant current circuits 304 and 305 are set to have the same constant current value and the PMOS transistors 302 and 303 are set to have different K-values, to thereby adjust a detection current value. However, it should be understood that the PMOS transistors 302 and 303 may be set to have the same K-value and the constant current circuits 304 and 305 may be set to have different constant current values, to thereby adjust the detection current value.

Figure 4:
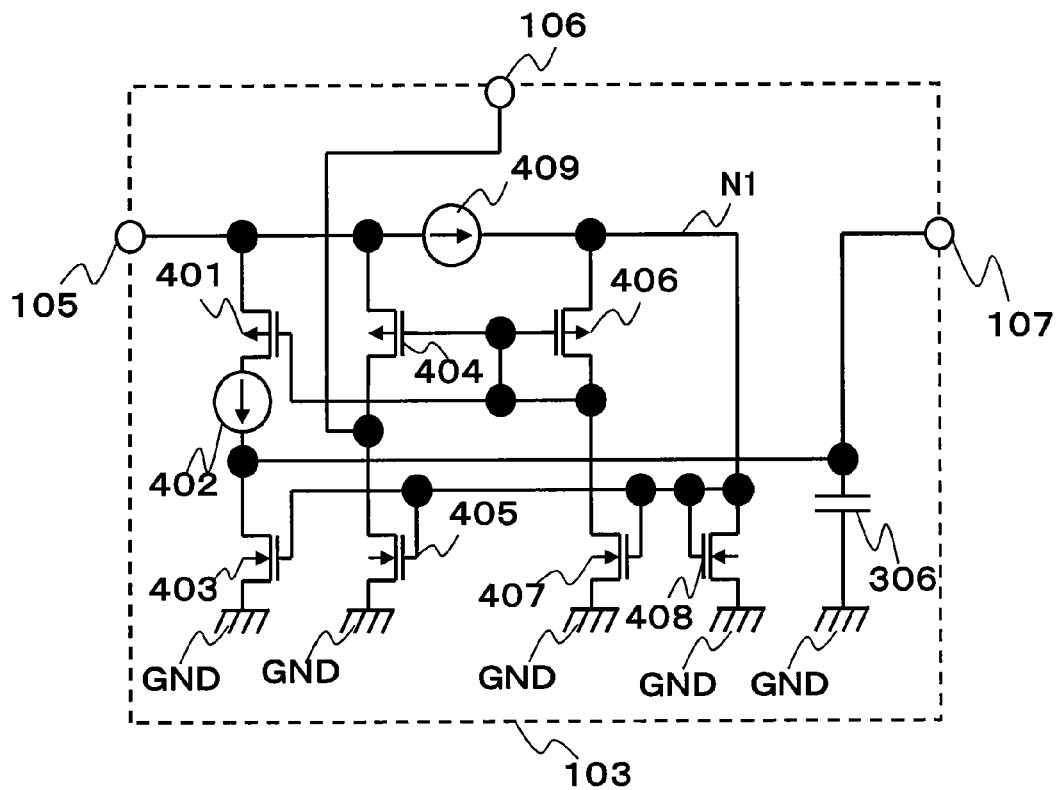
FIG. 4 is a circuit diagram illustrating another example of the control circuit used in the light receiving circuit.

FIG. 4 is a circuit diagram illustrating another example of the control circuit used in the light receiving circuit. As illustrated in FIG. 4, the control circuit includes constant current circuits 402 and 409, NMOS transistors 403, 405, 407, and 408, PMOS transistors 401, 404, and 406, and a capacitor 306. The PMOS transistor 401 has a smaller K-value than the PMOS transistor 406, and the PMOS transistor 404 has a smaller K-value than the PMOS transistor 401. Further, a constant current value of the constant current circuit 402 is set to twice a value of a drain current supplied by the NMOS transistor 403. The NMOS transistors 403, 405, and 407 mirror the same current.

The constant current circuit 409 has a current inflow terminal connected to the input terminal 105 and a current outflow terminal connected to a node N1. The PMOS transistor 401 has a drain connected to a current inflow terminal of the constant current circuit 402, a gate connected to a gate of the PMOS transistor 404 and a gate and a drain of the PMOS transistor 406, and a source connected to the input terminal 105. The constant current circuit 402 has a current outflow terminal connected to a drain of the NMOS transistor 403 and the control terminal 107. The PMOS transistor 404 has a drain connected to a drain of the NMOS transistor 405 and the control state signal output terminal 106, and a source connected to the input terminal 105. The PMOS transistor 406 has a source connected to the node N1. The node N1 is connected to a drain of the NMOS transistor 408 and gates of the NMOS transistors 408, 407, 405, and 403. The NMOS transistors 408, 407, 405, and 403 each have a source connected to the GND terminal. The capacitor 306 has one terminal connected to the control terminal 107 and the other terminal connected to the GND terminal.

First, an operation in a case where there is no fluctuation in a current flowing from the input terminal 105 is described. The voltage at the control terminal 107 is controlled to a desired value, and the drain current of the NMOS transistor 102 is controlled. In this case, the PMOS transistor 401 and the NMOS transistor 403 have the same drain current. In other words, in order that the PMOS transistor 406 and the PMOS transistor 401 have the same drain current, the voltage at the input terminal 105 is controlled to be slightly higher than a voltage at the node N1. However, because the PMOS transistor 404 has a smaller K-value than the PMOS transistor 401, the drain current of the PMOS transistor 404 is smaller than the drain current of the NMOS transistor 405. Therefore, the control state signal output terminal 106 outputs the GND terminal voltage.

Next, an operation in a case where the current flowing from the input terminal 105 is increased abruptly. The voltage at the input terminal 105 is increased at once, but the voltage at the control terminal 107 is not increased suddenly because the constant current circuit 402 and the capacitor 306 are provided. Accordingly, the voltage at the input terminal 105 remains increased until the drain current of the NMOS transistor 102 is increased by the increased amount of the current from the input terminal 105. Therefore, the PMOS transistors 401 and 404 continue to be completely turned ON for a while. During this period, the PMOS transistor 404 can allow a larger drain current to flow than the drain current of the NMOS transistor 405, and hence the control state signal output terminal 106 outputs the voltage at the input terminal 105.

Then, after a while, the voltage at the control terminal 107 is increased, and when the drain current of the NMOS transistor 102 is increased by the increased amount of the current from the input terminal 105, the state returns again to the above-mentioned state in which there is no fluctuation in the inflow current from the input terminal 105.

As described above, the control circuit 103 illustrated in FIG. 4 can implement all the same functions as those of the control circuit 103 illustrated in FIG. 3 with the different configuration therefrom. Besides, as compared to the resistive element 301 illustrated in FIG. 3, the constant current circuit 409 illustrated in FIG. 4 has a very high equivalent resistance, and hence the sensitivity with respect to a change in the current from the input terminal 105 is increased. Further, in the case of the same resistance, the constant current circuit 409 illustrated in FIG. 4 has a smaller occupied area than that of the resistive element 301 illustrated in FIG. 3. Therefore, if design is made for the same performance, the control circuit illustrated in FIG. 4 can be designed with a lower cost than that of the control circuit illustrated in FIG. 3.

Third Embodiment

Figure 5:
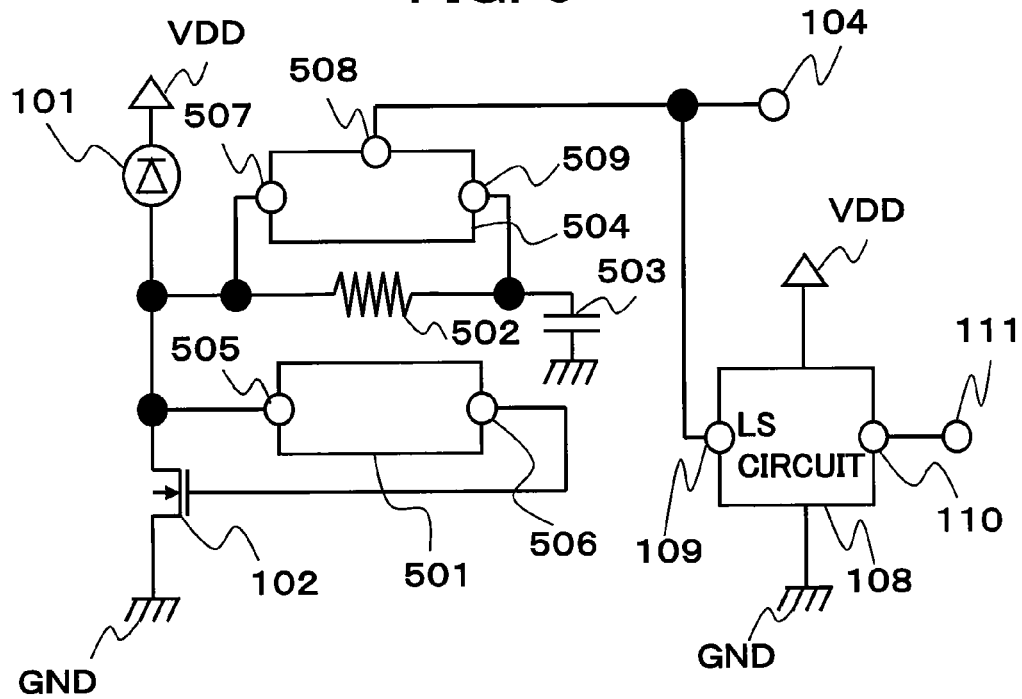
FIG. 5 is a schematic circuit diagram illustrating a light receiving circuit according to a third embodiment of the present invention.

FIG. 5 is a schematic circuit diagram illustrating a light receiving circuit according to a third embodiment of the present invention.

As illustrated in FIG. 5, the light receiving circuit includes a photodiode 101, an NMOS transistor 102, a low pass filter 501, a resistive element 502, a capacitive element 503, a detection circuit 504, an output terminal 104, a level shift circuit 108, and a CMOS level signal output terminal 111.

The photodiode 101 has an N terminal connected to a VDD terminal, and a P terminal connected to a drain of the NMOS transistor 102. The NMOS transistor 102 has a source connected to a GND terminal. The low pass filter 501 has an input terminal 505 connected to a drain of the NMOS transistor 102, and an output terminal 506 connected to a gate of the NMOS transistor 102. The resistive element 502 and the capacitive element 503 connected to series between the P terminal of the photodiode 101 and the GND terminal. The detection circuit 504 has a first input terminal 507 and a second input terminal 509 connected to the both ends of the resistive element 502, and a delay state signal output terminal 508 connected to the output terminal 104. The level shift circuit 108 has an input terminal 109 connected to an output terminal 104, and an output terminal 110 connected to the CMOS level signal output terminal 111. Although not illustrated, the VDD terminal is supplied with a positive voltage from a power source and the GND terminal is supplied with a reference voltage from the power source.

The photodiode 101 has the photoelectric conversion characteristics and supplies a current corresponding to the amount of incident light. The NMOS transistor 102 allows the current supplied from the photodiode 101 to flow its drain to its source. The low pass filter 501 outputs to the output terminal 506 only a DC component of a drain voltage of the NMOS transistor 102 input from the input terminal 505. The resistive element 502 forms a low pass filter together with the capacitive element 503, and this low pass filter passes only an AC component at a higher frequency than that of the low pass filter 501. The detection circuit 504 detects a voltage generated across the resistive element 502 by the first input terminal 507 and the second input terminal 509, and outputs a result of the detection from the delay state signal output terminal 508. Then, the level shift circuit 108 converts the signal input from the input terminal 109 into a CMOS level signal, and outputs the converted CMOS level signal from the output terminal 110.

The signal to be output from the delay state signal output terminal 508 of the detection circuit 504 is a signal of L at a GND terminal voltage when the voltage generated across the resistive element 502 is at less than a predetermined level, and is a signal of H at the drain voltage of the NMOS transistor 102 when the voltage generated across the resistive element 502 is at the predetermined level or more.

The light receiving circuit having the above-mentioned configuration operates as follows to detect a change in the amount of incident light.

First, an operation in a case where the environment is dark is described. No steady current flows through the photodiode 101, and hence the drain of the NMOS transistor 102 is almost at the GND terminal voltage. Accordingly, the input terminal 505 of the low pass filter 501 is almost at the GND terminal voltage. Therefore, the gate of the NMOS transistor 102 is almost at the GND terminal voltage, and hence the NMOS transistor 102 is OFF. Because the drain of the NMOS transistor 102 is almost at the GND terminal voltage, the delay state signal output terminal 508 of the detection circuit 504 outputs the signal of L at the GND terminal voltage regardless of the detection conditions. Therefore, the signal of L at the GND terminal voltage is output to the output terminal 104, and hence the signal of H at the VDD terminal voltage is output to the CMOS level signal output terminal 111.

Subsequently, in the above-mentioned dark environment, if an optical signal enters or the environment becomes bright suddenly, and the current suddenly flows from the photodiode 101, the drain voltage of the NMOS transistor 102 is increased until the current flowing to the NMOS transistor 102 is increased to the current supplied from the photodiode 101. During the period in which the drain voltage of the NMOS transistor 102 is increasing, the voltage is generated across the resistive element 502, and hence the detection circuit 504 determines that the voltage at the predetermined level or more is generated across the resistive element 502. Therefore, the signal of H at the drain voltage of the NMOS transistor 102 is output to the delay state signal output terminal 508 of the detection circuit 504. Therefore, during the above-mentioned period, the output terminal 104 outputs the signal of H at the drain voltage of the NMOS transistor 102, and the signal of L at the GND terminal voltage is output to the CMOS level signal output terminal 111.

Next, an operation in a case where the environment is bright is described. A steady current flows through the photodiode 101, and hence the drain of the NMOS transistor 102 is controlled to a voltage slightly higher than a threshold of the NMOS transistor 102. Further, in this case, there is no change in the drain voltage of the NMOS transistor 102, and hence no voltage is generated across the resistive element 502. Therefore, the detection circuit 504 determines that the voltage generated across the resistive element 502 is at less than the predetermined level, and outputs the signal of L at the GND terminal voltage to the delay state signal output terminal 508. Consequently, during the above-mentioned period, the output terminal 104 outputs the signal of L at the GND terminal voltage, and the signal of H at the VDD terminal voltage is output to the CMOS level signal output terminal 111.

Subsequently, in the above-mentioned dark environment, if an optical signal enters or the environment becomes more bright and the current suddenly flows from the photodiode 101, the drain voltage of the NMOS transistor 102 is increased until the current flowing to the NMOS transistor 102 is increased to the current supplied from the photodiode 101. During the period in which the drain voltage of the NMOS transistor 102 is increasing, the voltage is generated across the resistive element 502, and hence the detection circuit 504 determines that the voltage at the predetermined level or more is generated across the resistive element 502. Therefore, the signal of H at the drain voltage of the NMOS transistor 102 is output to the delay state signal output terminal 508 of the detection circuit 504. Consequently, during the above-mentioned period, the output terminal 104 outputs the signal of H at the drain voltage of the NMOS transistor 102, and the signal of L at the GND terminal voltage is output to the CMOS level signal output terminal 111.

After a while since the optical signal entered or the environment became bright suddenly, the capacitive element 503 is charged via the resistive element 502, and the voltage generated across the resistive element 502 is reduced and eventually eliminated. After another while, the NMOS transistor 102 can allow a current corresponding to the suddenly-increased amount of the photodiode 101 to flow. It should be therefore understood that the state returns to the above-mentioned state before the optical signal enters or the environment becomes bright suddenly.

Further, if the optical signal enters or the environment becomes more bright, and the drain voltage of the NMOS transistor 102 is still increased to the VDD terminal voltage level, the signal of the output terminal 104 is the CMOS level signal, and hence it should be understood that the level shift circuit becomes unnecessary.

As described above, according to the light receiving circuits of the above-mentioned first and second embodiments, if the voltage difference between the drain and the source of the NMOS transistor is increased to be a predetermined voltage or more until a time when the NMOS transistor can allow the photocurrent of the photodiode to flow, which is increased abruptly by the increase in the amount of light, the light receiving circuits detect that a desired change in the amount of light has occurred. However, the time when the NMOS transistor can allow the photocurrent of the photodiode, which is increased abruptly by the increase in the amount of light, is varied depending on the current supplied by the NMOS transistor. For example, if the environment is bright and a large current flows through the photodiode, and the NMOS transistor allows a large current to flow, the relevant time period is very short. The reason is that, as the NMOS transistor allows a larger current to flow, an increase amount of the gate voltage necessary to increase the current of the NMOS transistor by a desired amount becomes smaller. In other words, the reason is that the increase amount becomes small and the current of the NMOS transistor is increased fast. Accordingly, if the environment is bright, it takes a very short time for the NMOS transistor to allow the photocurrent of the photodiode to flow, which is increased abruptly by the increase in the amount of light. Therefore, an increase amount of the voltage difference between the drain and the gate of the NMOS transistor is also reduced. Consequently, if the environment is bright, in order to increase the voltage difference between the drain and the gate of the NMOS transistor to be the predetermined voltage or more, a larger change in the amount of light is necessary. In other words, the first and second embodiments of the present invention have a problem that, as the ambient light conditions are changed, the change amount in the amount of light to be detected is changed. Therefore, there is a problem that, in a case where setting is made so as not to detect a slow and small change in amount of light that occurs by a person moving across the sensor, a human hand coming close thereto, a curtain waving in the wind, or the like even when the environment is dark, only a very large change in amount of light can be detected when the environment is bright.

Aimed at solving the above-mentioned problems, there is a method in which the voltage difference between the drain and the gate of the above-mentioned NMOS transistor to be detected is corrected based on the drain current of the NMOS transistor. However, this method requires a complicated circuit configuration.

In view of the above, instead of detecting the voltage difference between the drain and the gate of the NMOS transistor 102, the light receiving circuit according to the third embodiment detects a voltage difference across the resistive element 502 in the additionally-provided low pass filter formed of the resistive element 502 and the capacitive element 503. Further, the low pass filter formed of the resistive element 502 and the capacitive element 503 is set to pass a higher frequency than a frequency that the low pass filter 501 can pass. Then, the low pass filter formed of the resistive element 502 and the capacitive element 503 is set to pass a voltage change at a slow frequency accompanying a change in amount of light that occurs by a person moving across the sensor, a human hand coming close thereto, a curtain waving in the wind, or the like.

With the above-mentioned configuration, the third embodiment of the present invention has the feature in that a certain change in the amount of light can be stably detected regardless of the ambient light conditions, in addition to the feature of the first embodiment of the present invention. In other words, in addition to the feature of the first embodiment of the present invention, the third embodiment of the present invention has the feature in that a certain change in amount of light can be stably detected even if the ambient light conditions are changed, without detecting a change in amount of light that occurs by a person moving across the sensor, a human hand coming close thereto, a curtain waving in the wind, or the like.

Fourth Embodiment

Figure 6:
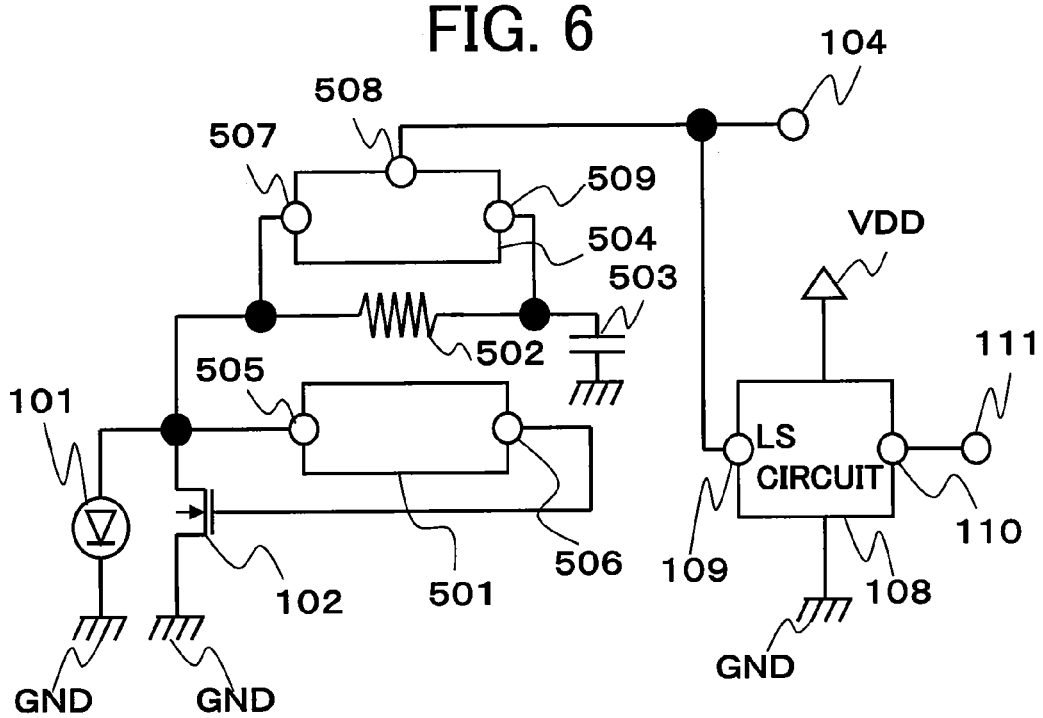
FIG. 6 is a schematic circuit diagram illustrating a light receiving circuit according to a fourth embodiment of the present invention.

FIG. 6 is a schematic circuit diagram illustrating a light receiving circuit according to a fourth embodiment of the present invention.

The light receiving circuit according to the fourth embodiment has substantially the same configuration as the light receiving circuit of the third embodiment illustrated in FIG. 5. The only difference is that the third embodiment of the present invention provides the configuration in which the N terminal of the photodiode 101 is connected to the VDD terminal, but in the fourth embodiment of the present invention, the N terminal of the photodiode 101 is connected to the GND terminal.

Further, the components other than the above-mentioned photodiode 101 are connected in the same way as in the third embodiment of the present invention illustrated in FIG. 5.

Besides, operations of the light receiving circuit according to the fourth embodiment are substantially the same as the operations of the light receiving circuit according to the third embodiment. The difference is that the drain voltage of the NMOS transistor 102 increases to around the VDD terminal voltage in some cases in the third embodiment of the present invention illustrated in FIG. 5, but in the fourth embodiment of the present invention, the drain voltage of the NMOS transistor 102 increases only to a generated voltage of the photodiode 101. Accordingly, in the fourth embodiment of the present invention, the signal of H output from the output terminal 104 is not increased to the generated voltage of the photodiode 101 or higher. Therefore, if it is necessary to output a CMOS level signal higher than the generated voltage, the level shift circuit 108 is necessary.

As described above, in the light receiving circuit according to the third embodiment, the current of the photodiode flows from the VDD terminal to the GND terminal, and hence the current of the photodiode is a consumption current of the light receiving circuit. Accordingly, when the environment is bright, the current of the photodiode is increased and as a result, the consumption current is also increased. However, in the light receiving circuit according to the fourth embodiment, a generated current of the photodiode is used, and hence the current of the photodiode does not flow from the VDD terminal to the GND terminal. Further, if there is no change in the amount of incident light, the level shift circuit consumes no current at all, either, because the GND terminal voltage is input to the input terminal thereof. Therefore, the light receiving circuit according to the fourth embodiment has the feature in that almost no consumption current is consumed, in addition to the feature of the light receiving circuit according to the third embodiment.

Figure 7:
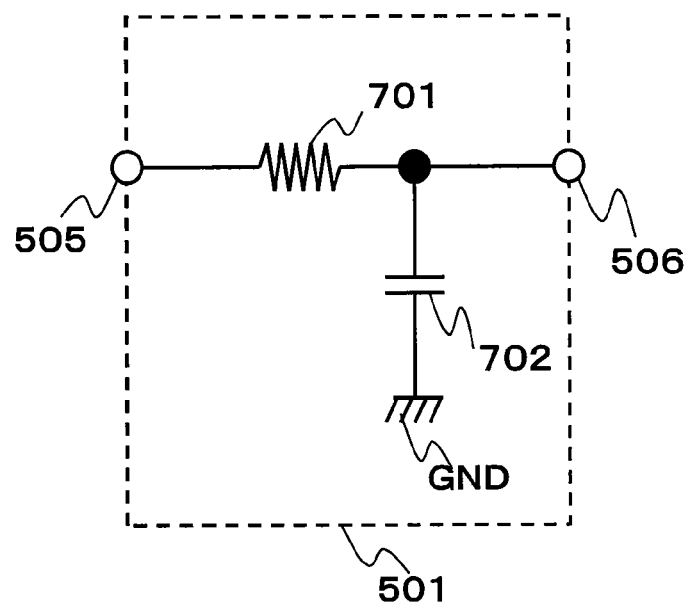
FIG. 7 is a circuit diagram illustrating an example of a low pass filter used in the light receiving circuit.

Now, a detailed configuration of the low pass filter 501 is described by way of specific circuit example. FIG. 7 is a circuit diagram illustrating an example of the low pass filter 501 used in the light receiving circuit. As illustrated in FIG. 7, the low pass filter 501 includes a resistive element 701 and a capacitive element 702.

The resistive element 701 has one terminal connected to the input terminal 505 and the other terminal connected to the output terminal 506 and one terminal of the capacitive element 702. The capacitive element 702 has the other terminal connected to the GND terminal. Note that, the low pass filter has a commonly-used configuration using the resistive element and the capacitive element, and hence description of the operation thereof is omitted.

Now, a detailed description and operation of the detection circuit 504 are described by way of specific circuit example.

Figure 8:
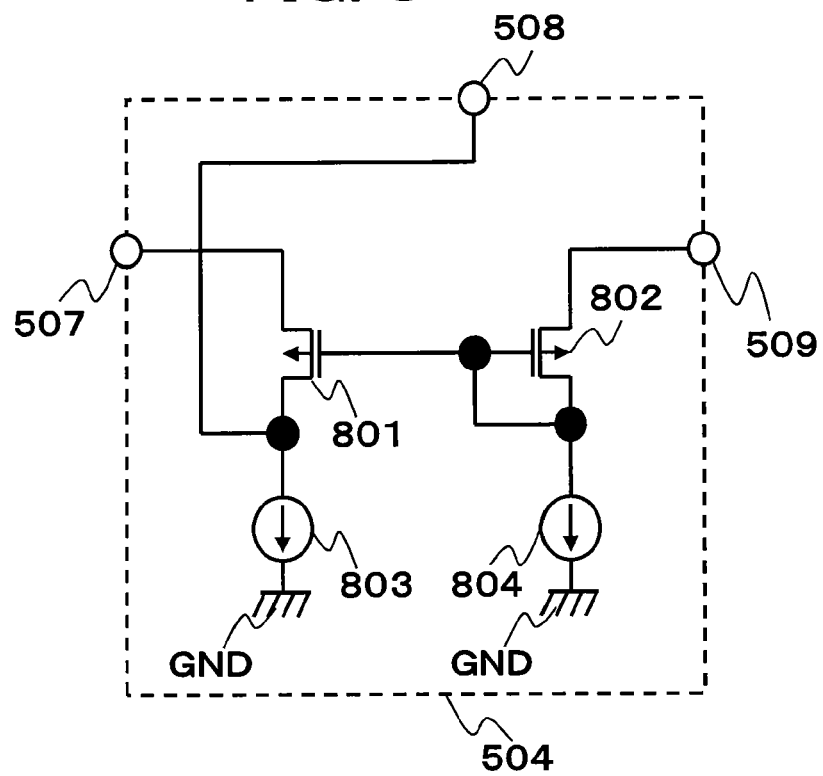
FIG. 8 is a circuit diagram illustrating an example of a detection circuit used in the light receiving circuit.

FIG. 8 is a circuit diagram illustrating an example of the detection circuit used in the light receiving circuit. As illustrated in FIG. 8, the detection circuit 504 includes PMOS transistors 801 and 802 and constant current circuits 803 and 804. The constant current circuit 803 and the constant current circuit 804 supply currents of the same value. Further, the PMOS transistor 801 has a smaller K-value than the PMOS transistor 802.

The PMOS transistor 801 has a drain connected to a current inflow terminal of the constant current circuit 803 and the delay state signal output terminal 508, a gate connected to a gate and a drain of the PMOS transistor 802 and a current inflow terminal of the constant current circuit 804, and a source connected to the first input terminal 507. The PMOS transistor 802 has a source connected to the second input terminal 509. The constant current circuits 803 and 804 each have a current outflow terminal connected to the GND terminal.

First, an operation in a case where the voltage at the first input terminal 507 is not higher than the voltage at the second input terminal 509 by a predetermined voltage or more is described. The constant current circuit 803 can allow a larger current to flow than a drain current that the PMOS transistor 801 allows to flow. Therefore, the signal of L at the GND terminal voltage is output to the delay state signal output terminal 508.

Next, an operation in a case where the voltage at the first input terminal 507 is higher than the voltage at the second input terminal 509 by the predetermined voltage or more is described. The PMOS transistor 801 can allow a larger drain current to flow than the current that the constant current circuit 803 allows to flow. Therefore, the signal of H at the voltage level input to the first input terminal 507 is output to the delay state signal output terminal 508.

Note that, the above-mentioned predetermined voltage is a value obtained by subtracting the gate-source voltage of the PMOS transistor 802, to which the current of the constant current circuit 804 flows, from the gate-source voltage of the PMOS transistor 801 necessary to allow the current of the constant current circuit 803 to flow. The constant current circuit 803 and the constant current circuit 804 can allow the currents of the same value to flow, and the PMOS transistor 801 has a smaller K-value than the PMOS transistor 802, and hence the above-mentioned gate-source voltage of the PMOS transistor 801 is higher than the above-mentioned gate-source voltage of the PMOS transistor 802. Therefore, the above-mentioned predetermined voltage is a positive value, and as the K-value of the PMOS transistor 801 becomes smaller than the K-value of the PMOS transistor 802, the predetermined voltage is increased more.

Further, in the detection circuits according to the third and fourth embodiments, the constant current circuits 803 and 804 are set to have the same current value and the PMOS transistors 801 and 802 are set to have different K-values, to thereby adjust the above-mentioned predetermined voltage value. However, it should be understood that the PMOS transistors 801 and 802 may be set to have the same K-value and the constant current circuits 803 and 804 may be set to have different constant current values, to thereby adjust the above-mentioned predetermined voltage value.

Now, a detailed configuration and operation of the level shift circuit 108 are described by way of specific circuit example.

Figure 9:
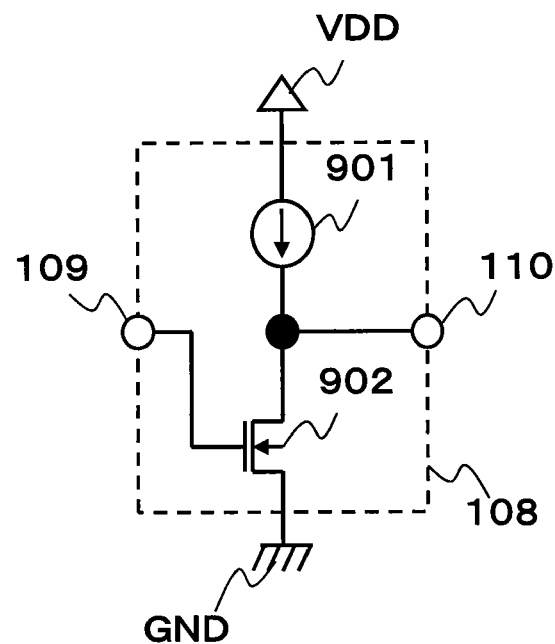
FIG. 9 is a circuit diagram illustrating an example of a level shift circuit provided at an output stage of the light receiving circuit.

FIG. 9 is a circuit diagram illustrating an example of the level shift circuit used in the light receiving circuit.

As illustrated in FIG. 9, the level shift circuit 108 includes an NMOS transistor 902 and a constant current circuit 901.

The NMOS transistor 902 has a drain connected to the output terminal 110 and a current outflow terminal of the constant current circuit 901, a gate connected to the input terminal 109, and a source connected to the GND terminal. The constant current circuit 901 has a current inflow terminal connected to the VDD terminal Although not illustrated, the VDD terminal is supplied with a positive voltage from a power source and the GND terminal is supplied with a reference voltage from the power source.

First, if the voltage at the input terminal 109 is low and a drain current of the NMOS transistor 902 is smaller than a current that the constant current circuit 901 allows to flow, the VDD terminal voltage is output to the output terminal 110.

First, if the voltage at the input terminal 109 is high and a drain current of the NMOS transistor 902 is larger than a current that the constant current circuit 901 allows to flow, the GND terminal voltage is output to the output terminal 110.

Further, if the input terminal 109 has the GND terminal voltage, a consumption current of the level shift circuit 108 is almost zero. Therefore, in the light receiving circuits according to the first to fourth embodiments, in the steady state in which there is no change in the amount of incident light, the consumption current of the level shift circuit 108 is almost zero.

Figure 10:
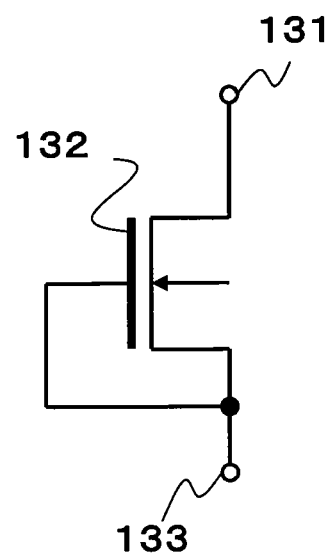
FIG. 10 is a circuit diagram illustrating an example of a constant current circuit used in the light receiving circuit.

FIG. 10 is a circuit diagram illustrating an example of the constant current circuit used in the light receiving circuit. The constant current circuit illustrated in FIG. 10 is constituted by a depletion mode NMOS transistor 132, in which a drain serves as a current inflow terminal 131, and a gate and a source serve as a current outflow terminal 133. With this configuration, a source-gate voltage of the depletion mode NMOS transistor 132 is made constant. Accordingly, under the condition of saturation operation, a constant drain current is obtained. Therefore, the constant current circuit is configured to allow a constant current to flow from the current inflow terminal 131 to the current outflow terminal 133.

Note that, the light receiving circuits according to the first to fourth embodiments are described by way of example, where the photodiode 101 is used. However, it should be understood that the same functions and features can be obtained by using another photoelectric conversion element having photoelectric conversion characteristics, such as an LED or a solar cell. Further, it should be understood that the above-mentioned functions and features can be obtained even if the role of each NMOS transistor is replaced with that of a PMOS transistor and the role of each PMOS transistor is replaced with that of an NMOS transistor. Still further, it should be understood that the same functions and features can be obtained even if the above-mentioned respective constant current circuits are formed by mirroring a constant current of a certain constant current circuit by a mirror circuit.

What is claimed is:

1. A light receiving circuit, comprising:
an output terminal;
a photoelectric conversion element configured to supply a current corresponding to an amount of incident light;
an NMOS transistor comprising a drain connected with, and configured to receive the current from, the photoelectric conversion element; and
a control circuit comprising a delay circuit; an input terminal that is at the same potential as the drain of the NMOS transistor; a control terminal connected to a gate of the NMOS transistor; and a control state output terminal connected to the output terminal,
wherein the control circuit is configured to output via the control state output terminal a control state output signal corresponding to a delay of the delay circuit when a drain voltage of the NMOS transistor is changed, and
wherein the light receiving circuit outputs, via the output terminal, the control state output signal as a detection signal of a change in the amount of the incident light.

2. The light receiving circuit according to claim 1, wherein the delay circuit comprises a low pass filter.

3. The light receiving circuit according to claim 1, wherein the photoelectric conversion element comprises a PN diode, including a P terminal connected to the drain of the NMOS transistor and an N terminal connected to a VDD terminal.

* * * * *